United States Patent [19]
Banniza et al.

[11] Patent Number: 5,680,060
[45] Date of Patent: Oct. 21, 1997

[54] METHOD OF AND CIRCUIT ARRANGEMENT FOR TERMINATING A LINE CONNECTED TO A CMOS INTEGRATED CIRCUIT

[75] Inventors: Thomas Banniza, Hemmingen; Helmut Preisach, Pleidelsheim, both of Germany

[73] Assignee: Alcatel NV, Netherlands

[21] Appl. No.: 574,550

[22] Filed: Dec. 19, 1995

[30] Foreign Application Priority Data

Dec. 22, 1994 [DE] Germany .................. 44 45 846.0

[51] Int. Cl.⁶ ............................................. H03K 19/0185
[52] U.S. Cl. .............................. 326/30; 326/32; 326/33; 326/86
[58] Field of Search ...................... 326/21, 30, 31–34, 326/86

[56] References Cited

U.S. PATENT DOCUMENTS

| | | | |
|---|---|---|---|
| 5,134,311 | 7/1992 | Biber et al. | 326/30 X |
| 5,162,672 | 11/1992 | McMahan et al. | 326/30 X |
| 5,463,331 | 10/1995 | Kuo | 326/86 |
| 5,546,016 | 8/1996 | Allen | 326/30 |
| 5,559,447 | 9/1996 | Rees | 326/30 |

FOREIGN PATENT DOCUMENTS

| | | |
|---|---|---|
| 0597315 | 5/1994 | European Pat. Off. . |
| 4305822 | 9/1994 | Germany . |

OTHER PUBLICATIONS

"Terminieren von Signalleitungen" by Safferthal, Rolf. In: Elektronik 22/1990, pp. 236–254.

Semiconductor Technology, Springer Publishing Company, Berlin, Heidelberg, NY, London, Paris, Tokyo, 1986—pp. 99–101 Tietze et al.

Primary Examiner—David R. Hudspeth
Attorney, Agent, or Firm—Ware, Fressola, Van Der Sluys & Adopphson

[57] ABSTRACT

When high frequency signals are transmitted to an integrated circuit through a lfine, the line must have a matched terminal resistance located as closely as possible to its end. Every portion of the line without a matched terminal resistance, and each branch of the line, produces disturbing signal reflections. In modern housings of large-scale integrated circuits the terminals are only separated by 0.5 mm, and it becomes increasingly more difficult to connect a resistance as closely as possible to the terminal of the integrated circuit. According to the invention, a field effect transistor ($T_R$), which functions as a terminal resistance, is located inside the integrated circuit. The value determined by the channel resistance is adjusted by means of a regulated control voltage, so that the effects of operating temperature, changes in the supply voltage and deviations in the integrated circuit caused by manufacturing processes have no effect on the resistance value needed for the line match.

7 Claims, 5 Drawing Sheets

5,680,060

METHOD OF AND CIRCUIT ARRANGEMENT FOR TERMINATING A LINE CONNECTED TO A CMOS INTEGRATED CIRCUIT

TECHNICAL FIELD

The invention concerns a method and a circuit arrangement for terminating a line connected to a CMOS integrated circuit.

BACKGROUND OF THE INVENTION

When transmitting electrical signals through lines, it is generally known to match the output impedance of the signal source and the input impedance of the signal drain to the characteristic impedance of the line, to ensure that the transmission is free of reflections. When technically realizing this condition, for example when transmitting high frequency signals to an integrated circuit through a line, care must be taken that the line is terminated as closely as possible to the end of the line. Every line portion without a matched terminal resistance, and every branch of the line create reflections of the signal, which lead to a deterioration of the transmission quality. This results in the generally known requirements of routing the line to the integrated circuit terminal without branching, to locate the terminal resistance as closely as possible to the integrated circuit terminal, and to match the value of the terminal resistance as accurately as possible to the characteristic impedance of the line. However, some problems occur when these requirements are carried out.

As a rule, large-scale integrated circuits have many inputs, which must be terminated with a resistance. In modern housings of large-scale integrated circuits, the terminal spacing is only 0.5 mm. Even if only every second terminal is used for a signal, the signal lines on the circuit board must have an average space of 1 mm. Thus, geometrically very small terminal resistances and special installation techniques are required to provide such narrow signal lines with a terminal resistance as closely as possible to the integrated circuit terminal. This problem is generally solved by reducing the conducting track density, which has the disadvantage that the packing density on the circuit board is smaller than is actually possible. The reduced conducting track density has the further disadvantage that the use of integrated circuits with small housings and very small terminal spacing becomes impossible.

Even if the terminal resistance is located directly at the integrated circuit terminal, a portion of the unmatched terminated line remains, namely the line through the housing and the bonding wire to the integrated circuit. Both line portions have an undefined impedance and represent a substitute LCR element that can cause unwanted overshooting (ringing) of the signal.

SUMMARY OF THE INVENTION

The result of this problem is the task underlying the invention, on the one hand to indicate a possibility for the arrangement of a terminal resistance which avoids the above described disadvantages, and on the other, to offer the possibility of matching the terminal resistance to different characteristic impedances, while taking the effects of operating temperature, changes in the supply voltage and manufacturing deviations in the integrated circuit into consideration in the design of the terminal resistance.

This task is fulfilled by the invention via a method terminating a line connected to a CMOS integrated circuit in a resistance equal to the characteristic impedance of the line, characterized in that a field-effect transistor providing the terminating resistance is incorporated into the CMOS integrated circuit, and that the gate voltage applied to the field-effect transistor is adjusted via a measuring circuit and a control circuit by comparing a voltage generated outside the CMOS integrated circuit with a voltage generated within the CMOS integrated circuit to produce such an input signal for the control circuit that the terminating resistance provided by the field-effect transistor is maintained at the required value regardless of manufacturing variations of the CMOS integrated circuit, of variations in operating temperature, and of variations in supply voltage.

It is also fulfilled by a circuit arrangement for terminating a line connected to a CMOS integrated circuit in a resistance equal to the characteristic impedance of the line, characterized in that the line is connected to the drain-source path of a field-effect transistor incorporated in the CMOS integrated circuit and providing the terminating resistance, the field-effect transistor having its gate terminal connected to the output of a control circuit whose input is connected to a measuring circuit which determines the difference between a voltage controlling the channel resistance of the field-effect transistor and a reference voltage.

The essence of the invention is that the terminal resistance is now a part of the integrated circuit, and is located closer to the signal drain than in technical solutions known before. The signal line is routed without branching via the integrated circuit terminal to the signal receiver. In practice, the line between the first active circuit element of the signal receiver and the terminal resistance is shorter than 1 mm, it therefore does not become an effective high frequency stub line for signal frequencies up to at least 1 GHz. Since the discrete external resistance at the line termination is no longer present, the insertion process and the related costs are also omitted. In addition, the space required for the terminal resistance on the circuit board has also been saved. By adjusting a control voltage, which determines the value of the terminal resistance, the line termination can be matched to different ambient conditions.

BRIEF DESCRIPTION OF THE DRAWINGS

The invention is explained in the following by means of a configuration example. In the pertinent drawing.

BEST MODE FOR CARRYING OUT THE INVENTION

Figure 1:
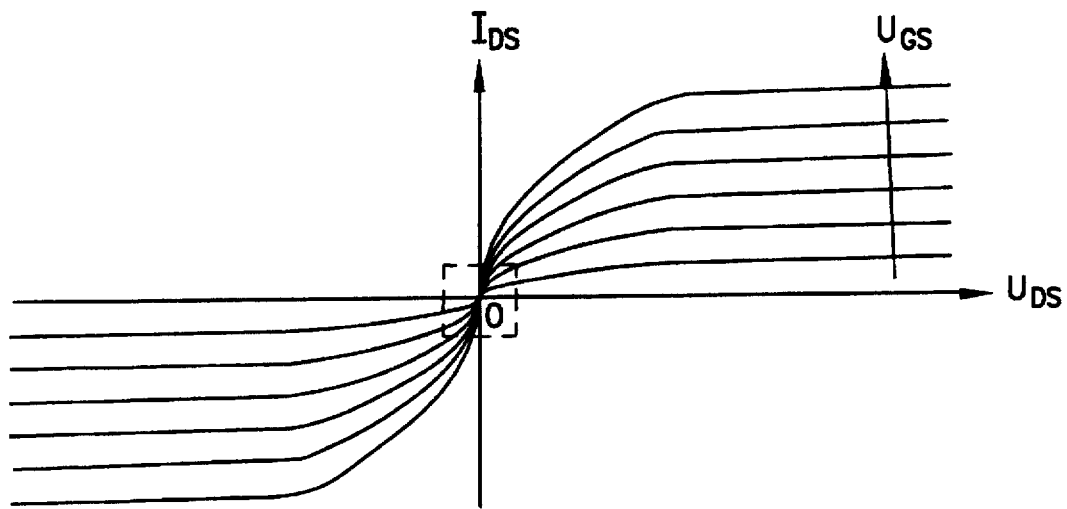
FIG. 1 is a characteristic curve of an enhancement-type n-channel field effect transistor, according to the state of the art.
Figure 2:
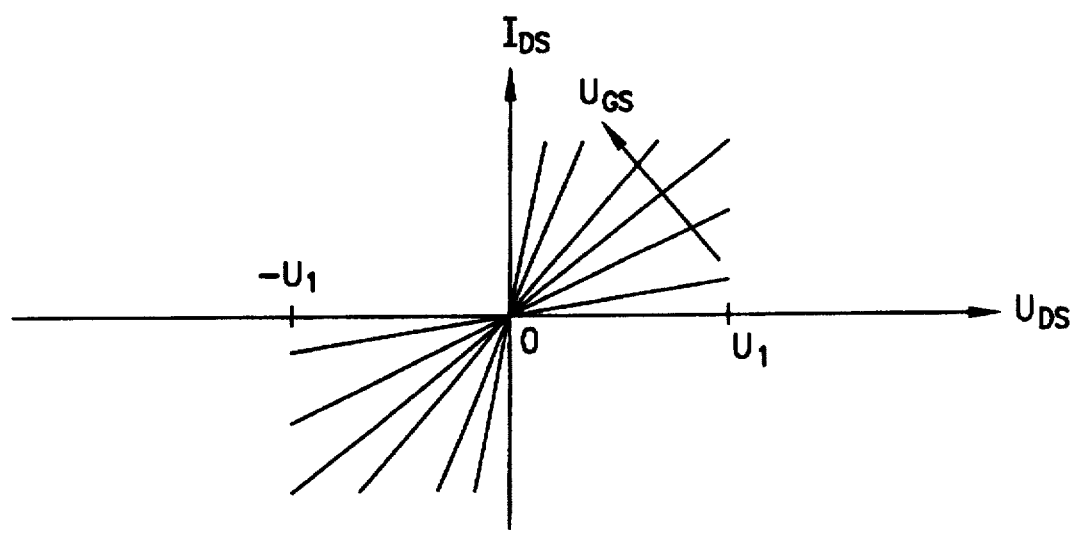
FIG. 2 is an enlarged section around the origin of the coordinates in FIG. 1.
Figure 3:
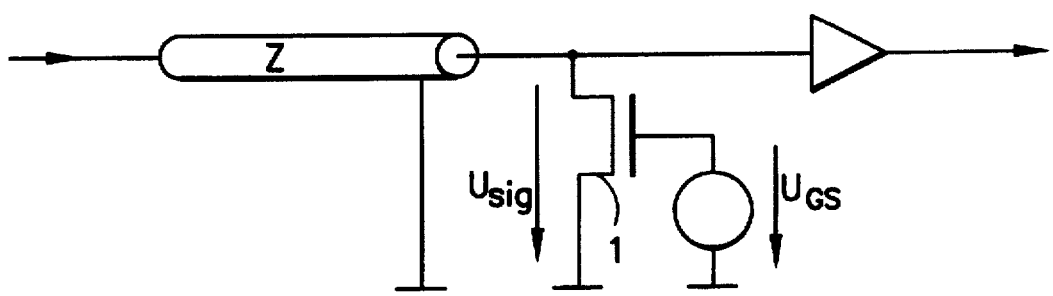
FIG. 3 is a basic circuit for using a field effect transistor as the terminal resistance of a line.
Figure 4:
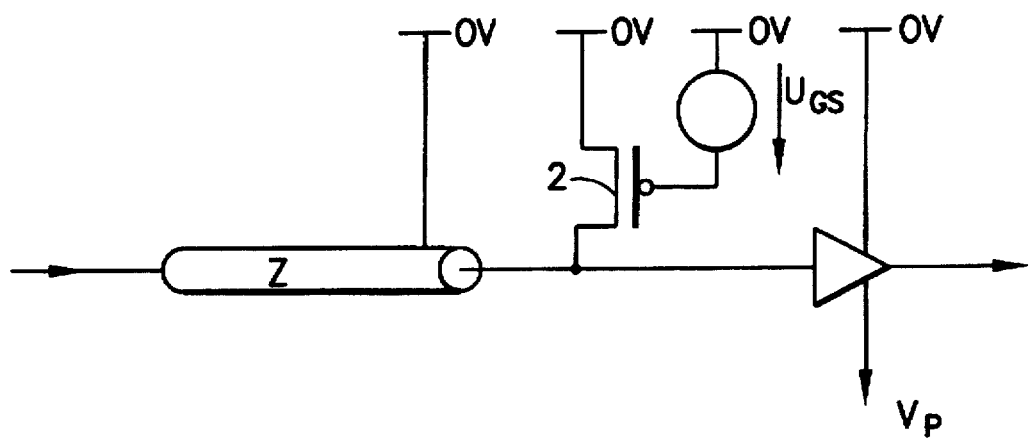
FIG. 4 is a circuit diagram of an arrangement for a field effect transistor serving as the terminal resistance of a CML-level system.

The invention utilizes the known physical facts depicted in FIGS. 1 and 2, that a field effect transistor (hereinafter called FET) behaves approximately like a resistor in the starting area of the UI curve's drain-source path. The value of this resistor can be controlled with the FET's gate-source voltage, see U. Tietze, Ch. Schenk: Semiconductor Technology, Springer Publishing Company, Berlin, Heidelberg, New York, London, Pads, Tokyo, 1986, pages 99–101. FIG. 1 depicts the characteristic curve of an enhancement-type n-channel FET to which the subsequent configurations also apply. The explanations also apply to other FET types, however the changed voltage and current signs must be observed. In FIG. 2, the broken line area around the origin of the coordinate in FIG. 1 has been enlarged. In this area, the dependence of the drain-source current $I_{DS}$ is an essentially linear function of the dependence of the drain-source current $U_{DS}$. The gradient $$dU_{DS}/dI_{DS}$$

of the characteristic curves is a function of the control voltage, the gate-source voltage $U_{GS}$, and the resistance of the drain-source channel can therefore be controlled with this voltage. As shown in FIG. 2, the characteristic curves are linear in the $-U_1 \leq U_{DS} \leq U_1$ area. In CMOS processes, the limit for $U_1$ is technically $U_1 \pm 1.2$ V. If the signal voltage $U_{sig}$ is present in a line within the linear area $-U_1 \leq U_{sig} \leq U_1$, the drain-source path of FET1 can be used as the terminal resistance of the line illustrated in FIG. 3. To make the resistance of FET 1 coincide with the characteristic impedance Z of the line, a corresponding resistance must be provided by selecting the gate-source voltage $U_{GS}$. The limitation of the signal voltage $U_{sig}$ on the linear area $-U_1 \leq U_{sig} \leq U_1$ is technically not a restriction, since as small a signal rise as possible is desirable for broad-band interfaces anyway, in order to keep the output loss, which is created in each signal slope by the recharging of the line, as small as possible. For example, an interface definition for a Current-Mode-Logic level system, briefly called a CML level system, is the technical norm, where the logical "1" is represented by a 0 V voltage, and the logical "0" by a voltage in the range between −400 mV and −1200 mV, depending on the application. FIG. 4 depicts the circuit arrangement of an FET that serves as the terminal resistance in a CML level system. Since the reference voltage of the system, 0 V in this case, is the positive supply voltage of the integrated circuit, a p-channel FET 2 is used in this instance. For example, the supply voltage of the integrated circuit is $V_p = -5$ V, so that the gate-source voltage $U_{GS}$ can be derived from the supply voltage and a separate auxiliary voltage is not required.

Figure 5:
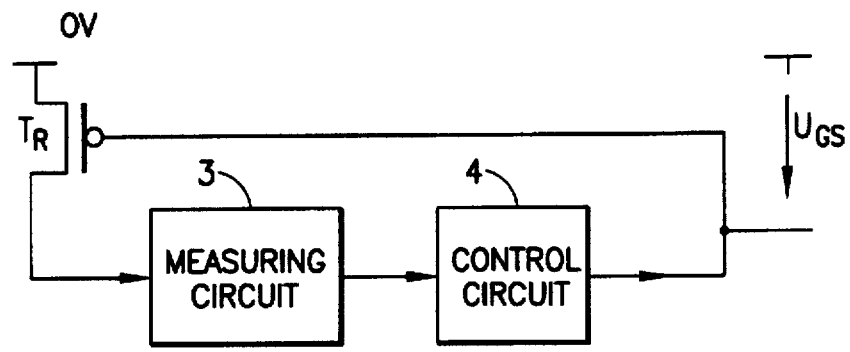
FIG. 5 is a circuit diagram for producing the gate-source voltage $U_{GS}$.

Although the use of an FET as the controllable resistance in a voltage divider is known in itself, see U. Tietze, Ch. Schenk loc. cit., its use as the terminal resistance of a line however involves special requirements. The gate-source voltage $U_{GS}$ cannot be adjusted for a fixed value, since the exact value that is required for a predetermined resistance, the channel resistance of the FET, depends on the CMOS integrated circuit. Still, to obtain a match of the channel resistance to the characteristic impedance of the line under different conditions, the respective value of the gate-source voltage $U_{GS}$ in FIG. 5 has to be determined by a measuring circuit 3, and must be held to the required value by a control circuit 4. Although in practice, integrated circuits often have more than 10 inputs whose signal lines must be terminated, the measuring circuit 3 and the control circuit 4 are required only once per integrated circuit for adjusting the gate-source voltage $U_{GS}$ of the FET $T_R$ which acts as the terminal resistance, since the influences of the manufacturing process, the operating temperature and the supply voltage have the same effect on all transistors of the CMOS integrated circuit.

Two configurations of the measuring circuit 3 are indicated for determining the correct value of the gate-source voltage $U_{GS}$.

Figure 6:
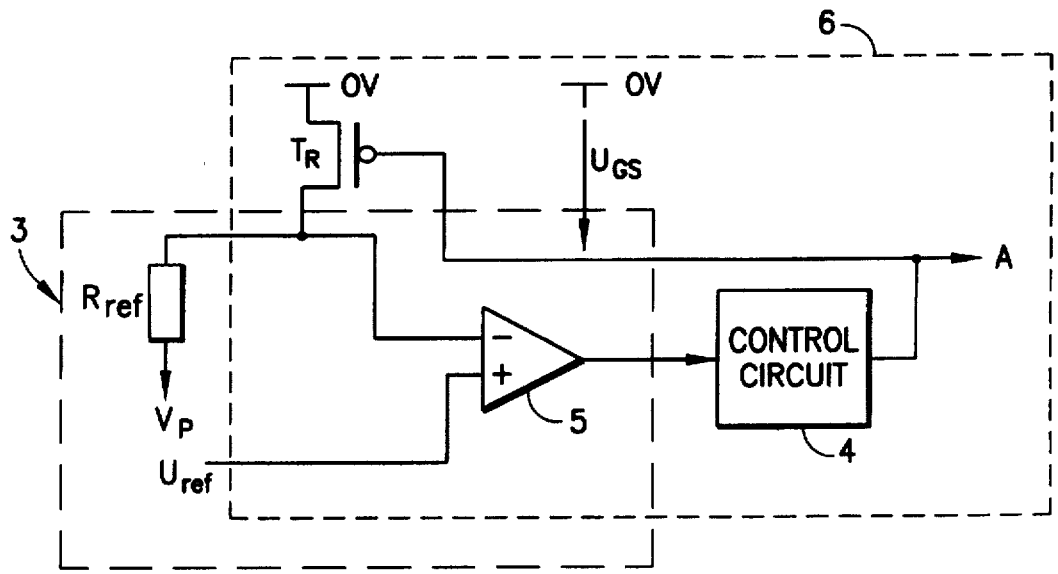
FIG. 6 is a circuit diagram of a first measuring circuit configuration.

In a first configuration according to FIG. 6, the measuring circuit 3 interacts with an FET $T_R$ which acts as the terminal resistance, hereafter briefly transistor $T_R$. The measuring circuit comprises a reference resistor $R_{ref}$ and a comparator 5. Both the transistor $T_R$ and the comparator 5 are components of the CMOS integrated circuit 6, hereafter briefly called integrated circuit, while the reference resistor $R_{ref}$ is located outside of the integrated circuit, and a reference voltage $U_{ref}$ needed for the comparator 5 is brought in from outside. The transistor $T_R$ and the reference resistor $R_{ref}$, whose value is known with sufficient precision, for example to within 1%, form a voltage divider, whose tap is connected to the first input of comparator 5. The reference voltage $U_{ref}$ is located at the second input of comparator 5. The result of comparing the output voltage of the voltage divider to the reference voltage $U_{ref}$ is supplied to the control circuit 4, which produces the gate-source voltage $U_{GS}$ for the transistor $T_R$, and adjusts it according to the result of the comparison. All other transistors of the circuit 6 integrated on a chip, which also form terminal resistances, are supplied with the same gate-source voltage $U_{GS}$ via terminal A of the circuit arrangement. Since the manufacturing process, the supply voltage and temperature are essentially the same on a chip, the channel resistance of the drain-source path of the transistors is adjusted to the desired value.

If the reference voltage $U_{ref}$ of the integrated circuit 6 is supplied from the outside, the dependence on the supply voltage $V_p$, is avoided in that the reference voltage $U_{ref}$ is not produced by an absolute voltage source, but is also derived by means of voltage dividers from the supply voltage $V_p$. The voltage divider can also be integrated, since the ratio of two integrated resistors can be very accurately attained and reproduced.

Figure 7:
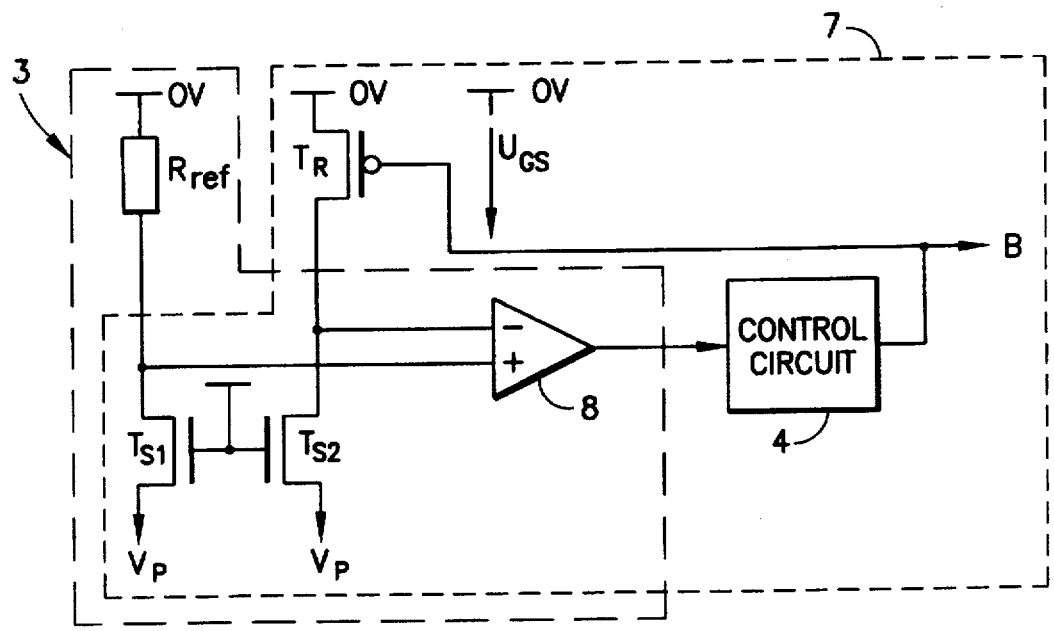
FIG. 7 is a circuit diagram of a second measuring circuit configuration.

A second configuration of the measuring circuit 3 is illustrated in FIG. 7. Accordingly, the measuring circuit comprises a reference resistance $R_{ref}$ located outside of the integrated circuit 7, and on the inside of the integrated circuit 7 is a transistor $T_R$ acting as the terminal resistance and thus; interacting with the measuring circuit. The measuring circuit also comprises a first FET $T_{S1}$ and a second FET $T_{S2}$, as well as a comparator 8. The first FET $T_{S1}$ acts as a power source and is connected to the reference resistance $R_{ref}$, whose value is known to within 1% for example. The second FET $T_{S2}$ also acts as a power source and is connected to transistor $T_R$ which acts as the terminal resistance. The first FET $T_{S1}$ and the second FET $T_{S2}$ have the same shape and size, so that the same current flows through the reference resistance $R_{ref}$ and the transistor $T_R$. The voltage drop through reference resistance $R_{ref}$ and the voltage drop through transistor $T_R$ are compared with the help of comparator 8. The result of the comparison is supplied to the control circuit 4, whereby the gate-source voltage $U_{GS}$ of transistor $T_R$ is adjusted until the difference between the voltage drops through the reference resistance $R_{ref}$ and through the transistor $T_R$ reach a minimum. At that point, the channel resistance of transistor $T_R$ is equal to the reference resistance $R_{ref}$. By selecting the reference resistance $R_{ref}$, the desired terminal resistance of the line provided by the transistor $T_R$ can be very precisely adjusted. All the other transistors of the circuit 7 integrated on one chip, which also form terminal resistances, are supplied with the same gate-source voltage $U_{GS}$ via terminal B of the circuit arrangement. Since the manufacturing process, the supply voltage and temperature are essentially the same on a chip, the channel resistance of the drain-source path of the transistors is adjusted to the desired value.

In both configurations of the measuring circuit 3 depicted in FIGS. 6 and 7, the control circuit 4 produces the required gate-source voltage $U_{GS}$ as a function of the result of the comparison by the respective comparators 5, 8. The control circuit 4 then functions as a proportional-integral controller. The gate-source voltage $U_{GS}$ is produced in different ways, depending on the desired precision and the possibilities allowed by the manufacturing process of the integrated circuit.

Figure 8:
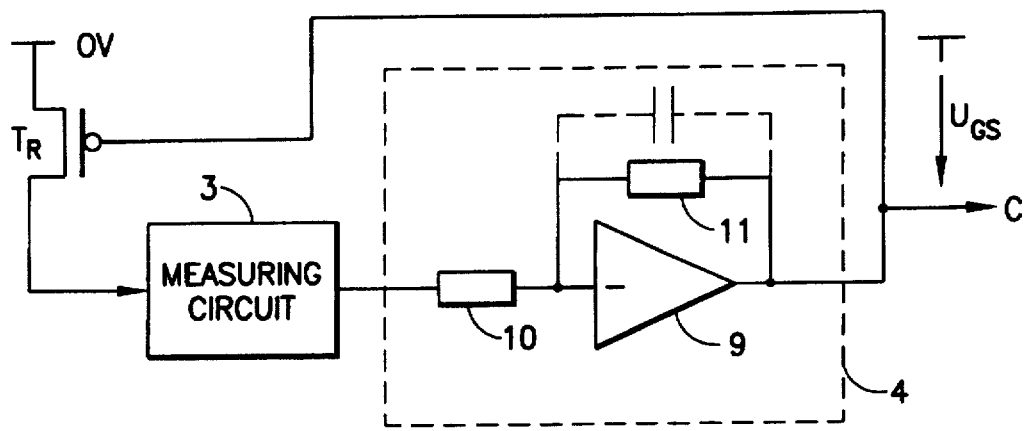
FIG. 8 is a circuit diagram of a first control circuit configuration.

FIG. 8 illustrates a circuit arrangement for control circuit 4, which is designed with an analogous circuit technology. According to FIG. 8, the control circuit 4 contains an operational amplifier 9, a first resistor 10 and a second resistor 11. The first resistor 10 is installed before the operational amplifier 9; the second resistor 11, with a parasitic capacitor drawn by broken lines, connects the input to the output of the operational amplifier 9, and as a negative feedback resistor determines the value of the output voltage, and thereby the gate-source voltage $U_{GS}$. This circuit variation with an analogous circuit technology is advantageous, if the manufacturing process is able to produce the operational amplifier 9 with the required characteristics, and if the distribution of the gate-source voltage $U_{GS}$ can be achieved via terminal C of the circuit arrangement to the transistors acting as terminal resistances, so that the coupling of disturbances to the lines with analog signals, which are sensitive thereto, can be avoided. These conditions are fulfilled in smaller chips by integrated circuit arrangements with mixed bipolar/CMOS technology. In that case, the operational amplifier 9 in particular must have as small an input current as possible, and as large an open loop gain as possible in order to perform the desired integrator function, and the controllability of the output signal must cover the range of values required for the gate-source voltage $U_{GS}$.

Figure 9:
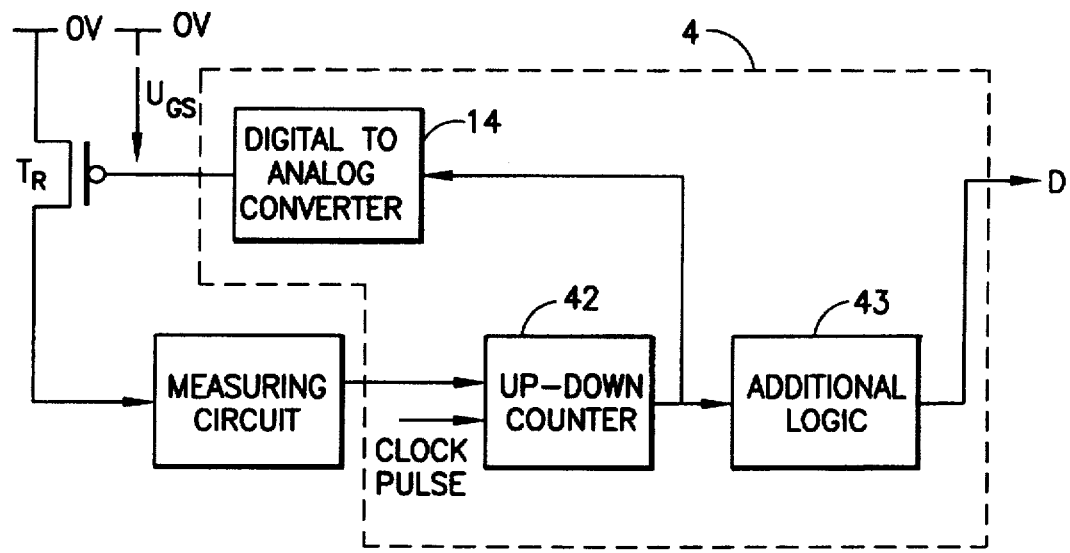
FIG. 9 is a circuit diagram of a second control circuit configuration.

One configuration of control circuit 4 in digital technology is shown in FIG. 9. The control circuit 4 comprises an up-down counter 12, an additional logic circuit 13 and a digital-analog converter 14. Depending on the result of the comparison of the input voltage by comparator 5, 8 in measuring circuit 3, the output voltage of the respective comparator 5, 8 is used to increase or decrease the reading of the up-down counter 12 by one. A digital picture of the gate-source voltage $U_{GS}$ is produced at the output of the up-down counter 12. This digital value is converted into an analog value by a digital-analog converter 14. The digital-analog converter 14 is located in the vicinity of the transistor $T_R$ that forms the terminal resistance, to keep the lines which conduct analog signals short. If the control is continuous, the reading of the up-down counter 12 fluctuates constantly, because the result of the comparison by comparator 5, 8 only indicates values as "too small" or "too large", but not as "equal to".

If the digital value produced by the up-down counter 12 is used to adjust the terminal resistance, the value of the terminal resistance is modulated by the change of the digital value in the last bit. This modulation of the resistance can cause an unwanted modulation of the useful voltage in the terminal resistance. To prevent this modulation, it is useful to separate the control of the transistor used as the line termination, from the control loop by means of an additional logic 13. This is achieved in that a second digital value is determined by a digital comparator circuit with memory, which represents the larger or also the smaller of the two values between which the up-down counter 12 fluctuates. In this way, the constant change is avoided and the second digital value only changes when the up-down counter 12 fluctuates for the first time between two new values. The output value of the additional logic circuit 13 is then converted into the analog value for the gate-source voltage $U_{GS}$ of each individual transistor or a group of transistors, via terminal D of the circuit arrangement in the vicinity of the transistors functioning as the terminal resistance. The word-width of the digital signal determines the accuracy of the terminal resistance adjustment.

Figure 10:
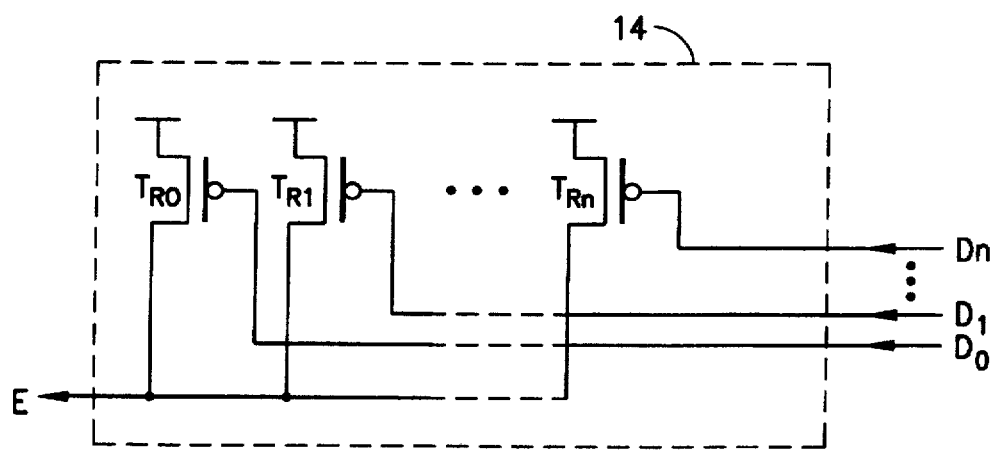
FIG. 10 is a circuit diagram of a digital-analog converter.

According to FIG. 10, the digital-analog converter 14 can be implemented with transistors $T_{R0}, T_{R1} \ldots, T_{Rn}$ switched in parallel, which can be individually activated by the binary information elements $D_0, D_1 \ldots, D_n$. Since the digital-analog converter 14 is a component of the control loop comprising the transistor $T_R$ which forms the terminal resistance, the measuring circuit 3 and the control circuit 4, it is not required that the digital-analog converter 14 converts a specified digital value into a precisely defined voltage. Rather, it must produce a strictly monotonously increasing voltage for an increasing digital value, and the total tolerances, produced in the control loop by the uncertainty of the digital-analog converter 14, must be captured by the control process. All transistors that form a terminal resistance must be controlled by a digital-analog converter 14 of the same type, to ensure that the same, not necessarily precisely predictable analog value is available for a specified digital value, in every instance.

According to FIG. 10, the transistor $T_R$ forming the terminal resistance of the line is divided into a parallel circuit of several transistors $T_{R0}, T_{R1} \ldots, T_{Rn}$. Depending on which and how many of the $T_{R0}, T_{R1} \ldots, T_{Rn}$ transistors are switched on, the parallel circuit produces the effect of a transistor with a variable channel resistance. In that case the digital control of the transistors causes the gate-source voltage to be either equal to the supply voltage $V_p$, or equal to 0 V. Thus, the gate-source voltage $U_{GS}$ in one transistor $T_R$ is not changed, rather the respective constant digital values of the gate-source voltage $U_{GS}$ vary the magnitude of the resulting transistor. The channel resistance of the total transistor $T_R$ can therefore be adjusted by means of the binary information $D_0, D_1 \ldots, D_n$. The terminal E of the digital-analog converter 14 leads directly to the line to be matched.

The magnitude of the transistors $T_{R0}, T_{R1} \ldots, T_{Rn}$ depends on the type of binary information $D_0, D_1 \ldots, D_n$. If a binary code is used, the transistors $T_{R0}, T_{R1} \ldots, T_{Rn}$, must contain binary steps as well. However, it is also possible to represent the binary information $D_0, D_1 \ldots, D_n$ by a priority coded data word, which means that only the number of lines at "0" is decisive for the adjusted value of the resulting transistor $T_R$. In that case the transistors $T_{R0}, T_{R1} \ldots, T_{Rn}$ to be switched in parallel have the same magnitude. The total number n of transistors $T_{R0}, T_{R1} \ldots, T_{Rn}$ depends on the requested solution and specifies the necessary word-width of the binary information $D_0, D_1 \ldots, D_n$.

What is claimed is:

1. A method of terminating a line connected to a CMOS integrated circuit in a resistance equal to the characteristic impedance of the line, characterized in that a field-effect transistor ($T_R$) providing the terminating resistance is incorporated into the CMOS integrated circuit, and that the gate voltage applied to the field-effect transistor is adjusted via a measuring circuit (3) and a control circuit (4) by comparing a voltage generated outside the CMOS integrated circuit (6, 7) with a voltage generated within the CMOS integrated circuit (6, 7) to produce such an input signal for the control circuit (4) that the terminating resistance provided by the field-effect transistor ($T_R$) is maintained at the required value regardless of manufacturing variations of the CMOS integrated circuit (6, 7), of variations in operating temperature, and of variations in supply voltage ($V_p$).

2. A circuit arrangement for terminating a line connected to a CMOS integrated circuit in a resistance equal to the characteristic impedance of the line, characterized in that the line (Z) is connected to the drain-source path of a field effect transistor ($T_R$) incorporated in the CMOS integrated circuit (6, 7) and providing the terminating resistance, the field-effect transistor ($T_R$) having its gate terminal connected to the output of a control circuit (4) whose input is connected to a measuring circuit (3) which determines the difference between a voltage controlling the channel resistance of the field-effect transistor ($T_R$) and a reference voltage ($U_{ref}$).

3. A circuit arrangement as claimed in claim 2, characterized in that the measuring circuit (3) consists of a comparator (5) having its first input connected to a reference-voltage source ($U_{ref}$) and having its second input connected to the junction point of the drain-source path of the field-effect transistor ($T_R$) and a resistor ($R_{ref}$), that this series combination of the drain-source path of the field-effect transistor ($T_R$) and the resistor ($R_{ref}$) is connected to a supply-voltage source ($V_p$), that the resistor ($T_{ref}$) is located outside the CMOS integrated circuit (6), and that the field-effect transistor ($T_R$) forms part of the CMOS integrated circuit (6).

4. A circuit arrangement as claimed in claim 2, characterized in that the measuring circuit (3) consists of a comparator (8) which has its first input connected to the junction point of a resistor ($R_{ref}$) and the drain-source path of a first field-effect transistor ($T_{S1}$) acting as a current source, and which has its second input connected to the junction point of the drain-source path of the field-effect transistor ($T_R$) providing the terminating resistance and the drain-source path of a second field-effect transistor ($T_{S2}$) acting as a current source, that the field-effect transistor ($T_R$) providing the terminating resistance, the first field-effect transistor ($T_{S1}$), and the second field-effect transistor ($T_{S2}$) are parts of the CMOS integrated circuit (7), and that the resistor ($R_{ref}$) is located outside the CMOS integrated circuit (7).

5. A circuit arrangement as claimed in claim 2, characterized in that the control circuit (4) is implemented with an operational amplifier (9).

6. A circuit arrangement as claimed in claim 2, characterized in that the measuring circuit (3) is connected to a counter (12) having its output coupled via a digital-to-analog converter (14) to the gate terminal of the field-effect transistor ($T_R$) providing the terminating resistance.

7. A circuit arrangement as claimed in claim 6, characterized in that the digital-to-analog converter (14) consists of the parallel combination of drain-source paths of at least two field-effect transistors ($T_{R0}$, $T_{R1}$ ... $T_{Rn}$) whose gate terminals are supplied with binary information ($D_0$, $D_1$ ... $D_n$) of a data word to determine which of the parallel-connected drain-source paths of the field-effect transistors ($T_{R0}$, $T_{R1}$ ... $T_{Rn}$) contribute to the total resistance of the drain-source paths.

* * * * *

UNITED STATES PATENT AND TRADEMARK OFFICE
CERTIFICATE OF CORRECTION

PATENT NO.　:　5,680,060
DATED　　　:　October 21, 1997
INVENTOR(S) :　Thomas Banniza
　　　　　　　　Helmut Preisach It is certified that error appears in the above-identified patent and that said Letters Patent is hereby corrected as shown below:

Item [57] Abstract, line 2, "lfine" should be --line--.

Signed and Sealed this

Seventeenth Day of March, 1998

*Attest:*

BRUCE LEHMAN

*Attesting Officer*　　　Commissioner of Patents and Trademarks